United States Patent [19]

Brewer

[11] Patent Number: 4,732,785

[45] Date of Patent: Mar. 22, 1988

[54] EDGE BEAD REMOVAL PROCESS FOR SPIN ON FILMS

[75] Inventor: James M. Brewer, Austin, Tex.

[73] Assignee: Motorola, Inc., Schaumburg, Ill.

[21] Appl. No.: 911,834

[22] Filed: Sep. 26, 1986

[51] Int. Cl.[4] .......................... B05D 5/12; B05D 3/12
[52] U.S. Cl. ................................ 427/240; 427/336; 437/231; 437/233
[58] Field of Search ................. 427/240, 82 X, 336; 437/231, 233

[56] References Cited

U.S. PATENT DOCUMENTS

| | | | |
|---|---|---|---|
| 4,113,492 | 9/1978 | Sato et al. | 427/240 |
| 4,510,176 | 4/1985 | Cuthbert et al. | 427/82 |
| 4,518,678 | 5/1985 | Allen | 427/240 |

*Primary Examiner*—Janyce A. Bell

*Attorney, Agent, or Firm*—John A. Fisher; Jeffrey Van Myers; David L. Mossman

[57] ABSTRACT

A process for removing the edge bead of films that are spun onto a planar substrate, which edge bead collects at the edge of the substrate. In processes such as the manufacture of integrated circuits, the edge bead of brittle substances such as glass, $SiO_2$, tends to shatter upon subsequent high temperature processing and generates particles which contaminate further processing of the integrated circuits. A pulsed or repeated application of a solvent on the edge of the substrate, a backwash step of constant rotational speed and a deceleration over time provides a means of smoothing and gradual cutting back of the spun on film edge. The deceleration spin has a starting rotational speed and a final rotational speed; and the subsequent backwash step is always at a constant rotational speed lower than the starting speed of the previous deceleration spin.

17 Claims, 9 Drawing Figures

EDGE BEAD REMOVAL PROCESS FOR SPIN ON FILMS

FIELD OF THE INVENTION

The invention relates to methods for forming thin films on substrates, and particularly relates to methods for treating the built-up edges of the films that tend to crack and shatter or slough off after application.

BACKGROUND OF THE INVENTION

Applying a film to a flat surface and spinning it on to a relatively uniform thickness is a technique that has been used in many environments, but is particularly common in the fabrication of integrated circuits since a uniform film can be applied to all parts of the circular wafer by placing a drop near the center and rapidly spinning the wafer. For many years, photoresist has been used as a spin on medium, and most recently actual glass, silicon dioxide ($SiO_2$) which is used as a dielectric layer, as a passivation layer, and for planarization, has been employed for specific processes. While most spin on processes are similar in nature, each material has unique characteristics that affect the final properties of the film that results on the surface of the wafer.

Spin on glass (SOG) is a solvated form of silicon dissolved in an alcohol solvent. Like its name implies, SOG is spun onto a semiconductor wafer, similar to the manner in which photoresist is spun on, namely by putting a small quantity in the center of the wafer and spinning the wafer at a high rotational velocity to spread the substance over the surface of the wafer in a uniform film by centrifugal force. The spin operation spreads the SOG and establishes the bulk film characteristics while driving off solvents and binders through evaporation. Because of the evaporation of solvent, glass precipitates and deposits onto the wafer during the spin operation. The wafers are subsequently heat treated (annealed) to drive off the remaining solvents resulting in a film of glass.

Cracking or shattering occurs in spin on glass if the bulk thickness of the SOG film exceeds a certain characteristic threshold value. This condition is unfavorable because it results in defects in the finished wafer. For the bulk of the film, however, the thickness is easily controlled throughout the spin on operation and subsequent heat treatment. This is not the case, however, for the edge 10 of the SOG film 12 that occurs just above the round edge 14 of the wafer 16 in the region of edge shattering or cracking 18 as seen in FIG. 1. It will be appreciated that the thickness of the films and the wafers illustrated in the Figures are greatly exaggerated to show detail.

Uncontrolled cracking or shattering of the film occurs in this region 18 thus turning each wafer 16 into a source of particles during subsequent processing. It is well known in the integrated circuit industry that particles of any kind, especially of the scale that are generated by the shattering of the curved or thick edges of a spun on film, are extremely undesirable in the wafer processing environment and can destroy valuable integrated circuit product. Thus, removing the film on the very edge of the wafer is a requirement, regardless of the film type, for the particle-generating phenomenon can occur with any spun on material. While photoresist does not ordinarily shatter, nevertheless it tends to slough off at the edge and interfere with the circuit topography on the interior of the wafer.

Conventional spin on methods do not control the problem of edge shatter. Thus, as shown in FIG. 2, attempts have been made to remove the edge bead 10 that occurs near the rounded edge 14 by applying the method of back side rinsing or edge bead removal (EBR) to the spin on material operation. The edge bead 10 is the edge of the film 12 near the round edge 14 of the wafer 16. Edge bead removal refers to a process that is common in photoresist operations where the resist application is followed by spraying a solvent 20 on the back side 22 of the wafer 16 via symbolically represented nozzle 24. As the wafer 16 spins, the solvent 20 creeps over the outer edge 14 of the wafer 16 to remove the edge bead 10 of resist 12. Another means of EBR involves directing a jet of solvent at the wafer periphery while the wafer is spinning, as disclosed in U.S. Pat. No. 4,510,176. Attempts at edge bead removal of SOG, in contrast with photoresist, have been abandoned in the past because cracking was not eliminated. As shown in FIG. 3, past attempts served only to "push" the edge bead 26 back and pile the material up and simply relocate the site of the cracking 18. While a piled up edge bead can be detrimental if it is composed of photoresist, since it may slough off and interfere with further processing, as noted, known EBR techniques are somewhat successful with photoresist. However, the use of such methods on other materials such as SOG have failed and merely relocated the site of the particle generation.

Attempts to date have taken a single step approach using some type of alcohol to serve as the EBR solvent. In this case EBR is performed in a single step with little attention to the chemistry of the process or the fluid dynamics. This approach has resulted in processes that do not achieve the goal of reducing or eliminating shattering at the edge of the film. The above approach has been successful for photoresist operations where cracking and final defectivity of the film is not the critical issue. While photoresist is removed after each step, the spin on glass remains on the wafer permanently resulting in visual defects. The edge cracking of photoresist can cause blocked implants as well as deformation of etched patterns.

One interesting EBR technique is seen in U.S. Pat. No. 4,510,176 which describes a method for removing the edge bead region from a coated semiconductor wafer by directing a jet of solvent at the wafer periphery while the wafer is spinning. The flow patterns of debris resulting from this removal are controlled to prevent contamination of the chip sites on the wafer.

SUMMARY OF THE INVENTION

Accordingly, it is an object of the present invention to provide a process for removing the edge bead at the edge of a film that is spun onto a disc and smoothing the edge, in other words, controlling the geometry of the edge bead to prevent cracking and shattering.

Another object of the present invention is to provide an edge bead removal process that can be readily integrated with the process for spinning on the film without the need for additional specialized equipment.

It is another object of the present invention to provide an edge bead removal process that may be applicable to a variety of spin on materials.

In carrying out these and other objects of the invention, there is provided, in one form, a method for removing an edge bead of a film that has been spun on to the surface of a disc having an edge wherein the edge bead resides near the edge of the disc. The method involves multiple treatments of the edge bead with a solvent application, where each treatment comprises the steps of (1) spinning the disc at a rotational speed that decreases over time, from a first speed to a second speed; and (2) applying to the edge of the disc a solvent in which the edge bead is soluble, while spinning the disc in a backwash step at a third speed less than the first speed. The first speed of each successive treatment is less than the first speed of the previous treatment.

DETAILED DESCRIPTION OF THE INVENTION

Figure 1:
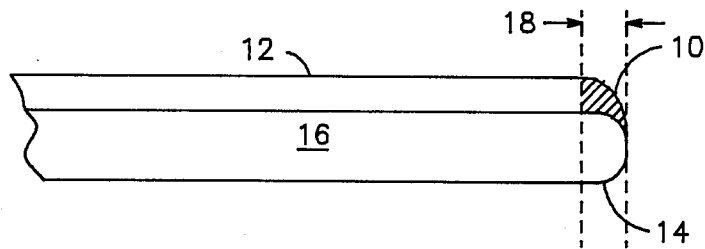
FIG. 1 is a schematic illustration of a film edge on a disc showing the edge region of shattering and cracking.

The edge bead removal process of the invention, which is synonymous with film edge smoothing, may be applied to any film edge where the film was spun onto a planar surface, such as a disc or wafer. The inventive process is unique in that it employs a solid-liquid extraction approach to the problem of cracked and shattered film edges 10 in region 18. When the material 12 at the edge 14 of the wafer 16 "beads up", it has a very large propensity to shatter upon subsequent hot processing. These flakes or particles can remain on the wafer 16 or migrate to other wafers during handling, and can contribute substantially to the yield loss of the integrated circuits being built due to particulate defectivity.

The inventive edge bead removal process performs edge bead removal in multiple steps, but in a particular sequence of multiple steps. For the example shown in FIG. 4, three steps or solvent applications are illustrated. Additional or fewer steps in the processing sequence may be used, depending upon the type of material removed, and the invention is not limited thereby except as noted in the claims. Spin on glass is assumed to be the film material of interest for the purpose of illustration only. Other materials, even photoresist which will slough off and cause damage, can be successfully treated with the process of this invention.

Figure 4:
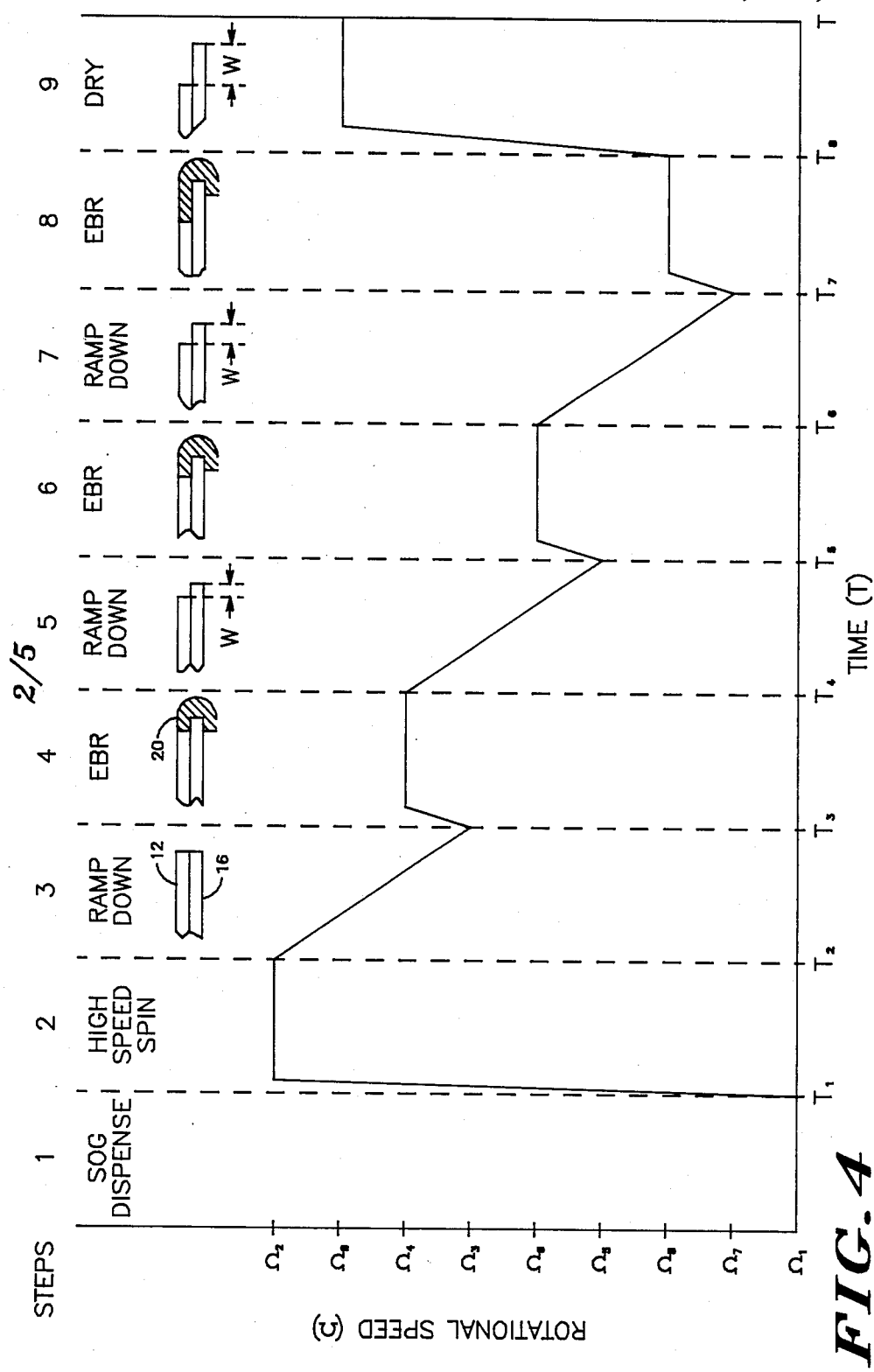
FIG. 4 is a chart illustrating the method of the invention.

For each step in the EBR process following the initial coating of SOG which is shown as dispense step 1 and high speed spin step 2, the rotational speed is decreased, then maintained at or quickly accelerated up to that step's backwash speed. While FIG. 4 shows that the rotational speed ramp down step ends at a rotational speed lower than the rotational speed at the next backwash step, the ramp down may end right at the rotational speed of the backwash step, ready for the solvent to be applied. One of the key points of the invention is that each subsequent backwash step is done at a reduced speed from the starting speed before the speed was "ramped down" prior to the backwash step. Optionally, the speed during the backwash step may be increased or decreased during the solvent application as long as the backwash starting speed and backwash spinning speed are lower than the starting speed before the previous deceleration. Solvent is applied throughout the backwash step. The process is treated as a simple solid-liquid extraction (desorption) problem where the solvent liquid is used to dissolve the solute solid that it is in contact with. The process can be applied to any backside rinsing operation where control of the edge bead geometry is desired.

To select the proper solvent, one must use the fundamental principle of chemistry that "like dissolves like". That is, one must select a solvent for which the solute, in this case, silicon dioxide, has a high solubility. This simply increases the capacity of each EBR step to dissolve material and hold it in solution. This solubility characteristic is particularly important at the end of an EBR step where the solvent supply is turned off and solute has a tendency to redeposit or pile up if it has saturated the solvent. This phenomena also provides the driving force for extraction and a higher value of solubility increases the efficiency of the extraction.

Figure 5:
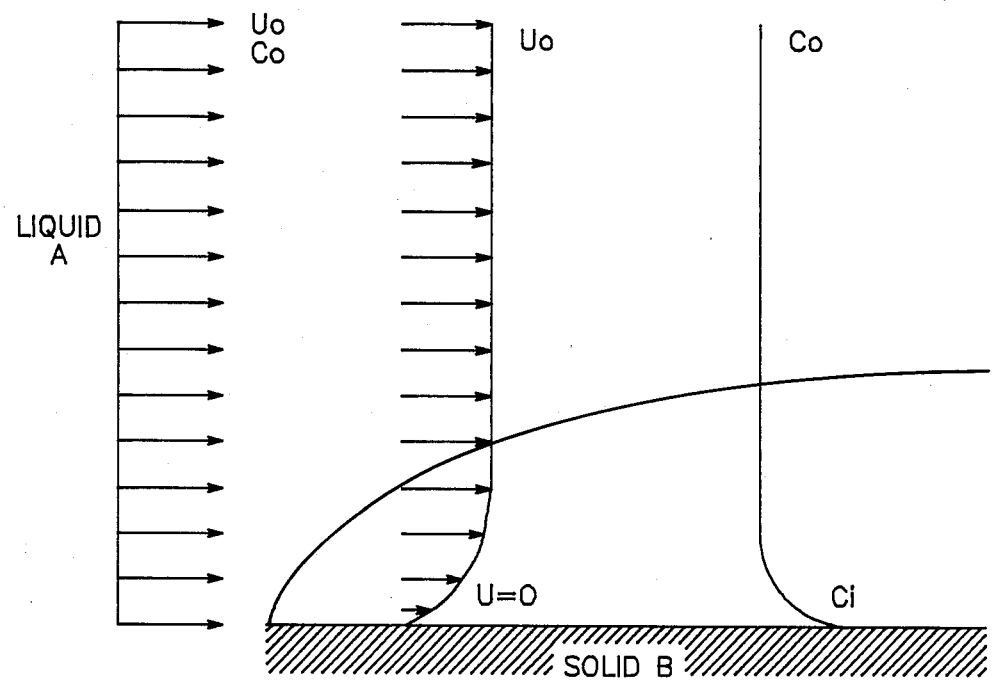
FIG. 5 is a schematic illustration of the extraction of a planar solid into a liquid flowing over it.

The "pulsed" or "staged" nature of the process is also an important invention feature and exploits the fundamentals of simple mass transfer operations. We can examine a solid-liquid operation where a solvent is used to extract a solid into a liquid phase as it flows past the solid schematically illustrated in FIG. 5. Some liquid A serves as the solvent and flows past and is in intimate contact with the planar surface of some solid B which serves as the solute; in this case the SOG film. For equilibrium conditions, the velocity of the fluid in the bulk is some constant ($U_o$) as is the concentration of the solute ($C_o$). In the boundary layer region, however, the fluid velocity at the interface is zero and increases to the bulk value while the interface concentration of solute is $C_1$ and decreases to the bulk value.

The solubility of the solute in the solvent provides the driving force for the extraction. In the transient case, when the solvent 20 initially contacts the solute 10, the value of $C_i$ is equal to zero, thus the driving force is very high and the solvent is not yet saturated. The process is pulsed or staged to refresh the solvent supply and thus maintain the extractive driving force. The pulsing action also minimizes the amount of solute 10 in the solvent 20 that is available for redeposition and pile up into simply a pushed back edge bead 26 which explains why prior EBR schemes failed.

Finally, the process employs the principles of fluid mechanics to select the rotational speed for each step. As the rotational speed of the wafer 16 on the chuck (not shown) is decreased, the distance W that the EBR fluid travels inward is increased, see FIGS. 4 and 6. Thus, the speed is successively decreased to "chip away" the edge 10. In addition, upon acceleration, the bead of solvent 28 has a tendency to move away from the center of the wafer 16 or "pull back." This phenomenon is used to control the movement, or damping effect, of the EBR solvent 20 toward the wafer 16 center during the initiation of each EBR step.

A somewhat more detailed description of the process of the invention as presented in FIG. 4 will now be given in view of the mechanisms discussed above. While certainly the invention uses well known principles and fundamentals, the exact and proper application of these principles and fundamentals to the edge bead removal problem, remained for the applicant to discover.

Shown in FIG. 4 is a chart illustrating the various steps involving one embodiment of the invention. In step 1, a small amount of SOG 12 is applied to the wafer 16. Wafer 16 may be spinning at some first rotational speed, $\Omega_1$. In step 2, the wafer is highly accelerated in its spin to rotational speed $\Omega_2$ and held there for a period of time from $T_1$ to $T_2$. Up to this point, the application of SOG film 12 to wafer 16 has followed conventional processing. However, if the film 12 were allowed to dry, the cracking and splintering problems of the edge 10 would occur.

Figure 2:
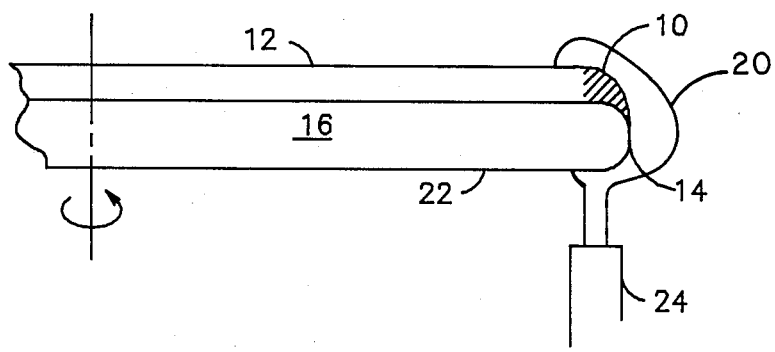
FIG. 2 is a schematic illustration of a film edge on a disc undergoing conventional edge bead removal treatment.
Figure 3:
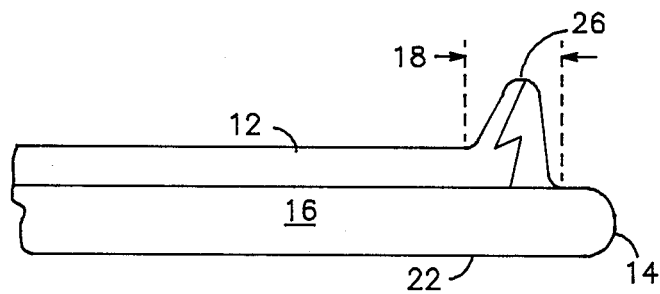
FIG. 3 is a schematic illustration of a problem with the conventional edge bead removal treatment, particularly with respect to SOG films.
Figure 6:
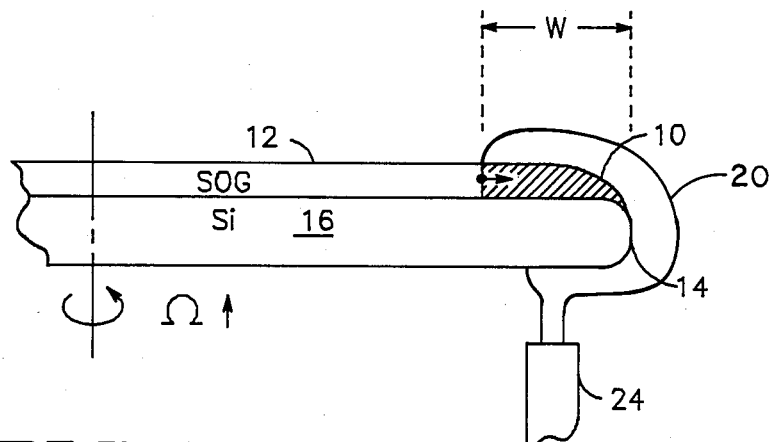
FIG. 6 is a schematic illustration showing how the width, W, of the region of the edge bead covered by the solvent is decreased as the rotational speed, $\Omega$, *is increased*.

The next procedure actually involves the EBR process of the invention. After step 2, the rotational speed of the spinning wafer is gradually reduced or "ramped down" to a third rotational speed $\Omega_3$, over a period of time from $T_2$ to $T_3$ in step 3. In step 4, solvent 20 is applied to the edge 14 of the wafer 16, typically from the back side 22 thereof as shown in FIGS. 2 and 6 and the wafer 16's rotational speed is rapidly increased from $\Omega_3$ to a fourth speed $\Omega_4$ that is between $\Omega_2$ and $\Omega_3$. Alternatively, speed $\Omega_4$ may equal rotational speed $\Omega_3$. After the wafer 16 is spun for a time from $T_3$ to $T_4$ at a constant speed of $\Omega_4$ during which fresh solvent is applied the entire time, the speed is gradually ramped down to $\Omega_5$, which is below $\Omega_3$ in step 5 from $T_4$ to $T_5$. This first application of solvent 20 will cut back the edge 10 from the edge of the wafer 14 a small distance W as shown at the top of step 5 in FIG. 4.

The solvent application outlined in the previous paragraph may be viewed as one pulse of the process of the invention which may be repeated until the edge 10 of film 12 on wafer 16 is as smooth as desired. However, recalling the fact that the single solvent application of prior EBR techniques was unsatisfactory, the solvent application step should be repeated at least once more. For example, in step 6 of FIG. 4, a fresh application of solvent 20 is made to the wafer edge 14 while the rotational speed of the wafer 16 is rapidly increased to a sixth rotational speed $\Omega_6$ which is between $\Omega_4$ and $\Omega_5$ for a time from approximately $T_5$ to $T_6$. Solvent is applied continually during this backwash step. Alternatively as noted for the first step, rotational speed $\Omega_6$ may be the same as speed $\Omega_5$. Then the wafer's speed is gradually decreased from $\Omega_6$ to new rotational speed $\Omega_7$, which is less than $\Omega_5$, over the time period from $T_6$ to $T_7$ in step 7. The distance W from the wafer edge 14 to the edge 10 of the SOG layer 12 is further increased by a small amount and the edge 10 is further smoothed.

A third application of fresh solvent 20 is made to the edge 14 of wafer 16 as shown in step 8, during the time the rotational speed is rapidly increased to and held at an eighth rotational speed $\Omega_8$ which is between $\Omega_6$ and $\Omega_7$ from $T_7$ to $T_8$. Again, alternatively $\Omega_8$ may equal rotational speed $\Omega_7$. In a final step 9, the rotational speed is again very rapidly increased, this time to $\Omega_9$ which may be faster than speeds $\Omega_3$ through $\Omega_7$, to rapidly dry the wafer from $T_8$ to $T_9$. This third solvent application will again increase the distance W from the edge of the film 10 to the edge of the wafer 14 as well as further smooth the edge 10. The exact number of solvent applications for a successful treatment cannot be specified since it depends on the nature of the material in film 12 and the nature of solvent 20 and the solubility of the film material in the solvent 20. While there may be some concern that the distance W will affect the available wafer area for device fabrication, it will be understood that W in actual fact is very small and does not consume appreciable useful area.

Figure 7:
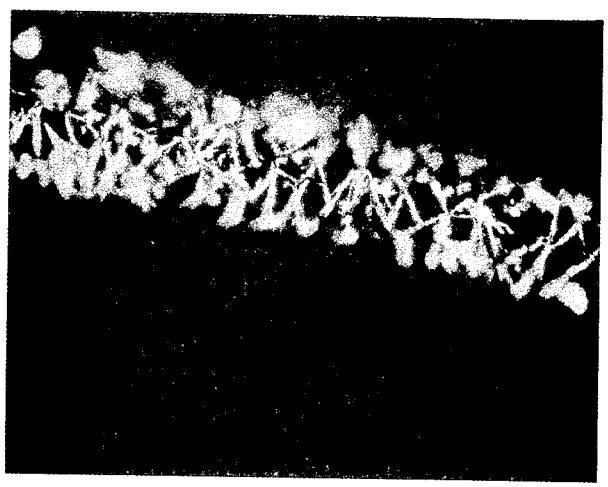
FIG. 7 is an optical microscope photograph of an edge of a film on a wafer not treated according to the method of the invention showing its cracked and shattered nature, corresponding to FIG. 1.
Figure 8:
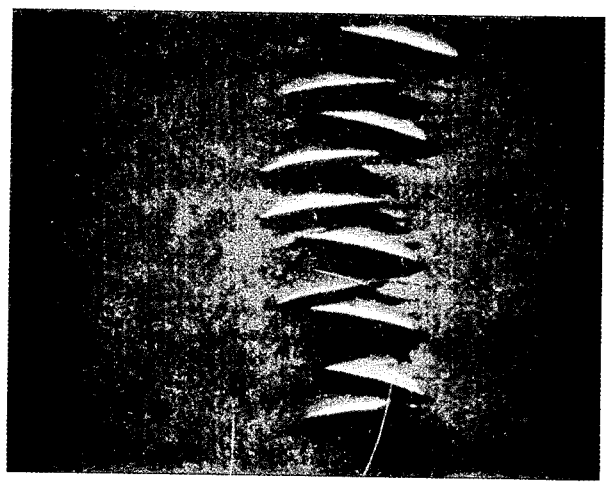
FIG. 8 is a scanning electron microphotograph (SEM) of an edge of a film on a wafer treated with solvent in one application according to a prior art method showing its cracked and shattered nature, corresponding to FIG. 3.
Figure 9:
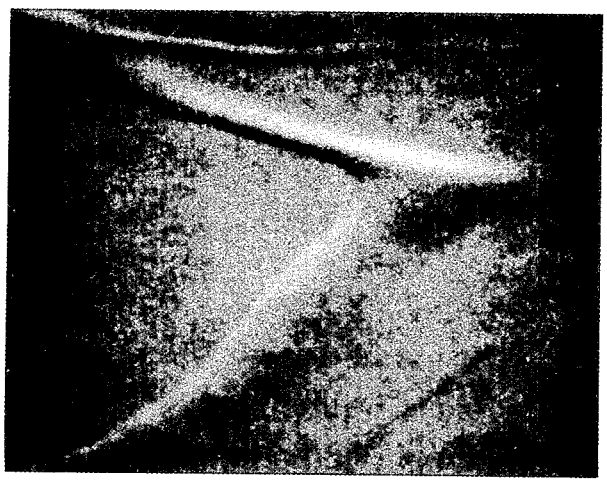
FIG. 9 is a SEM of an edge of a film on a wafer treated according to the method of the invention illustrating its smooth nature.

As a further illustration of the usefulness of the present invention, FIG. 7 is shown and is an optical microscope photograph of a silicon dioxide film edge that has not been smoothed by the process of the invention. The jagged and shattered nature of the untreated edge may be readily appreciated. Similarly, FIG. 8 is a scanning electron microphotograph (SEM) of the edge of a film that has been treated with a solvent once according to a conventional method which merely pushed back the edge bead which still exhibits cracking and shattering. By way of contrast, FIG. 9 is a SEM of a film edge that has been treated using the process of the invention, and it may be seen that the edge appears smooth with no indication of splintering and further no indication of an edge bead that has simply been pushed back which will crack and generate particles upon further processing, as in FIG. 8.

I claim:

1. A method for removing an edge bead of a film that has been spun on to the surface of a disc having an edge wherein the edge bead resides near the edge of the disc, the method comprising the steps of multiple treatments of the edge bead with a solvent application, wherein each treatment comprises the steps of:
   spinning the disc at a rotational speed that decreases over time, from a first speed to a second speed; and
   applying to the edge of the disc a solvent in which the edge bead is soluble, while spinning the disc at a third speed less than the first speed;
wherein the first speed of each successive treatment is less than the first speed of the previous treatment.

2. The method of claim 1 wherein the disc is a semiconductor wafer and the film is a spin-on-glass (SOG) film.

3. The method of claim 1 wherein the disc has two flat, opposite surfaces and the film is applied to the top surface and the solvent is applied to the bottom surface near the edge.

4. The method of claim 1 wherein the first speed of each successive treatment after a first treatment is between the first and second speeds of the previous treatment and the second speed of the successive treatment is below the second speed of the previous treatment.

5. A method for removing an edge bead of a film that has been spun on to the surface of a disc having an edge wherein the edge bead resides near the edge of the disc, the method comprising the steps of multiple treatments of the edge bead with a solvent application, wherein each treatment comprises the steps of:
   spinning the disc at a rotational speed that decreases over time, from a first speed to a second speed; and applying to the edge of the disc a solvent in which the edge bead is soluble, while spinning the disc at a third speed less than the first speed, but at least equal to the second speed;

wherein the first speed of each successive treatment is less than the first speed of the previous treatment.

6. The method of claim 5 wherein the disc is a semiconductor wafer and the film is a spin-on-glass (SOG) film.

7. The method of claim 5 wherein the disc has two flat, opposite surfaces and the film is applied to the top surface and the solvent is applied to the bottom surface near the edge.

8. The method of claim 5 wherein the first speed of the of each successive treatment after a first treatment is between the first and second speeds of the previous treatment and the second speed of the successive treatment is below the second speed of the previous treatment.

9. A method for removing an edge bead of a film that has been spun on to the surface of a disc having an edge wherein the edge bead resides near the edge of the disc, the method comprising the steps of:

a first treatment comprising:
spinning the disc at a rotational speed that decreases over time, from a first speed to a second speed;
applying to the edge of the disc a solvent in which the edge bead is soluble while spinning the disc at a third speed less than the first speed; and a successive treatment comprising:
spinning the disc at a rotational speed that decreases over time, from a first speed which is less than the first speed of the first treatment, to a second speed; and
reapplying fresh solvent to the edge of the disc while spinning the disc at a third speed less than the first speed of this successive treatment.

10. The method of claim 9 wherein the disc is a semiconductor wafer and the film is a spin-on-glass (SOG) film.

11. The method of claim 9 wherein the treatments are repeated until the edge bead is removed.

12. The method of claim 9 wherein the disc has two flat, opposite surfaces and the film is applied to the top surface and the solvent is applied to the bottom surface near the edge.

13. A method for forming a film of material spun onto a semiconductor wafer wherein the material film has a smooth edge comprising the steps of:

dispensing a solution of the material of the spin on film onto a semiconductor wafer having a surface and an edge;
spinning the wafer at a starting speed for a constant speed time period to distribute the solution of material over the surface of the wafer incidentally forming an edge bead at or near the edge of the wafer; and
performing a plurality of treatments, each treatment comprising the steps of:

reducing the rotational speed of the wafer from a first speed to a second speed;
applying a quantity of a fresh solvent to the edge of the wafer wherein the film material is soluble in the solvent while spinning the wafer at a third speed less than the first speed of the previous step.

14. The method of claim 13 wherein the third speed is also at least equal to the second speed.

15. The method of claim 13 wherein the semiconductor wafer is silicon and the spin on film is a spin-on-glass (SOG) film.

16. The method of claim 13 wherein the wafer has two flat, opposite surfaces and the film is applied to the top surface and the solvent is applied to the bottom surface near the edge.

17. A method for forming a film of spin-on-glass (SOG) on a semiconductor wafer wherein the SOG film has a smooth edge comprising the steps of:

dispensing a SOG solution onto a semiconductor wafer having a flat top surface, a flat bottom surface and an edge;
spinning the wafer at a first rotational speed for a first time period to distribute the spin-on-glass solution over the top surface of the wafer incidentally forming an edge bead near the edge of the wafer;
a first solvent treatment comprising: reducing the rotational speed of the wafer from the first to a second speed;
applying a first quantity of fresh solvent to the edge of the wafer from the bottom surface of the wafer, wherein the edge bead is soluble in the solvent while spinning the wafer at a third rotational speed that is less than the first speed but at least equal to the second speed;
a second solvent treatment comprising:
reducing the rotational speed of the wafer from a first speed to a second speed where the first speed is lower than the first speed of the previous treatment and the second speed is lower than the second speed of the previous treatment;
applying a second quantity of fresh solvent to the edge of the wafer from the bottom surface of the wafer while spinning the wafer at a third rotational speed that is less than the first speed but at least equal to the second speed; and
a third solvent treatment comprising:
reducing the rotational speed of the wafer from a first speed to a second speed wherein the first speed is lower than the first speed of the previous treatment and the second speed is lower than the second speed of the previous treatment; and
applying a third quantity of fresh solvent to the edge of the wafer from the bottom surface of the wafer while spinning the wafer at a third rotational speed that is less than the first speed but at least equal to the second speed of the third solvent treatment; and
repeating the solvent treatments until the edge of the film is smooth.

* * * * *